United States Patent
Ouellette et al.

(10) Patent No.: US 6,333,872 B1
(45) Date of Patent: Dec. 25, 2001

(54) SELF-TEST METHOD FOR TESTING READ STABILITY IN A DUAL-PORT SRAM CELL

(75) Inventors: Michael R. Ouellette, Westford; David J. Wager, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/707,201

(22) Filed: Nov. 6, 2000

(51) Int. Cl.$^7$ ................................................. G11C 7/00
(52) U.S. Cl. ............................... 365/189.06; 365/189.06; 365/194; 365/230.05; 714/719; 714/720
(58) Field of Search ............................ 365/201, 189.06, 365/194, 230.05; 714/719, 720

(56) References Cited

U.S. PATENT DOCUMENTS

| | | | |
|---|---|---|---|
| 5,222,066 | 6/1993 | Grula et al. | 371/21.1 |
| 5,386,392 | 1/1995 | Cantiant et al. | 365/233 |
| 5,513,318 | 4/1996 | van de Goor et al. | 395/185.01 |
| 5,579,322 | 11/1996 | Onodera | 371/22.3 |
| 5,742,557 | * 4/1998 | Gibbins et al. | 365/230.05 |
| 5,781,480 | 7/1998 | Nogle et al. | 365/189.04 |
| 5,812,469 | * 9/1998 | Nadeau-dostie et al. | 365/201 |
| 5,896,330 | * 4/1999 | Gibson | 365/201 |
| 5,946,262 | 8/1999 | Randolph et al. | 365/230.05 |
| 5,952,863 | 9/1999 | Jones et al. | 327/295 |
| 5,973,955 | 10/1999 | Nogle et al. | 365/154 |
| 5,973,985 | 10/1999 | Ferrant | 365/230.05 |
| 5,978,279 | 11/1999 | Park | 365/189.04 |
| 6,070,256 | * 5/2000 | Wu et al. | 714/718 |

OTHER PUBLICATIONS

SRAM Cycle Time Test Procedure, Research Disclosure, Jun. 1998, p. 790, International Business Machines Corporation L.P. Freeman et al., Prevention of Unknown States (Indeterminate Data) in Multi–ORT Arrays During Random Pattern Testing, IBM Technical Disclosure Bulletin, vol. 29. No. 3, Aug. 1986, pp. 1209–1210.

K.S. Daghir et al., Valid Output Indicator of Multi–ORT Arrays, IBM Technical Disclosure Bulletin, vol. 28, No. 4, Sep. 1985, pp. 1690–1693.

L.P. Freeman et al., Prevention of Unknown States (Indeterminate Data) In Multi–Port Arrays During Random Pattern Testing, IBM Technical Disclosure Bulletin, vol. 29, No. 3, Aug. 1986, pp. 1209–1210.

* cited by examiner

*Primary Examiner*—Son T. Dinh
(74) *Attorney, Agent, or Firm*—McGinn & Gibb, PLLC; Robert A. Walsh, Esq.

(57) ABSTRACT

A structure and method for testing multi-port SRAM cells includes a test controller connected to at least one multi-port SRAM cell (the test controller is adapted to store a pattern into the multi-port SRAM cell and generate a stability test restore clamp), a read/write controller connected to the multi-port SRAM cell (the read/write controller is adapted to simultaneously activate a plurality of wordline ports on the multi-port SRAM cell while the stability test restore clamp is enabled), and a timing control circuit connected to the read/write controller. The timing control circuit is adapted to vary an activation time of the wordline ports. The read/write controller reads from the multi-port SRAM after the stability test restore clamp is deactivated. The read/write controller activates the wordline ports for each multi-port SRAM cell in an array sequentially while all bitlines in the array are held on by the stability test restore clamp. The structure also includes a logic device connected to the test controller adapted to prevent the stability test restore clamp from being enabled unless a test is being performed. The timing control circuit is adapted to be selectively externally controllable to vary the activation time of the wordline ports. The timing control circuit can include a plurality of delay units adapted to be selectively engaged to vary the activation time of the wordline ports. The stability test restore clamp is enabled for at least a wordline pulse.

20 Claims, 3 Drawing Sheets

SELF-TEST METHOD FOR TESTING READ STABILITY IN A DUAL-PORT SRAM CELL

BACKGROUND OF THE INVENTION

1. Field of the Invention

The present invention generally relates to testing of computer memory cells and more particularly to an improved method and system for testing multi-port SRAM cells that tests the situation where multiple ports are accessed within a critical time.

2. Description of the Related Art

Multi-port static random access memory SRAM cells are well known in the art. For example, as shown in FIG. 1, a conventional 2-port SRAM cell includes cross-coupled inverters 100 connected to NFET transistors 101–104. The 2-port SRAM cell is bordered by the port A wordline select 125, the port B wordline select 126, the port A bitline true and complement 115, 116 and the port B bitline true and complement 120, 121. All wordlines 125, 126 and bitlines 115, 116, 120, 121 are connected to an addressing unit and a read/write controller which controls the writing to and reading from the selected SRAM cell. FIG. 1 also illustrates bitline restore devices 105 108 (PFET transistors) that are connected to voltage sources 130 and the port A bitline restore select line 110 and the port B bitline restore select line 111.

In operation, a read cycle begins with bitline restore control lines 110 and 111 in the low state (voltage at ground) and bitline pairs 115, 116 and 120, 121, respectively, in the precharged high state (voltage at Vdd). Wordlines 125 and 126 also start in the low state. The internal storage nodes start in a state where one of them (150 or 151) is in the high state and the other (151 or 150) is in the low state. For example, assume that node 150 (complement node) starts in the low state and node 151 (true node) starts in the high state. This would reflect a logical "one" stored in the cell.

For a port A read operation, node "Restore A"(110) switches to the high state, turning off PFETs 105, 107 and 141 and tri-stating port A's true and complement bitlines 115, 116. Port A's wordline 125 switches to the high state, turning on NFETs 101 and 103 and connecting port A true and complement bitlines (115 and 116) to the internal storage nodes of the cell. In this example, bitline115 will remain in the high state while bitline116's capacitance discharges into the cell node (150) that is in the low state. This causes the voltage on node 150 to rise "slightly" until the bitline116 is fully discharged, at which point, node 150's voltage returns to ground. If this low internal node (150) rises significantly, it can cause the cell nodes to fully switch, thereby causing the cell's stored data to change it's logical value from a "one" to a "zero". This problem is commonly referred to, by those skilled in the art, as "read instability". A static SRAM cell must be designed to be "read stable". Furthermore, an adequate test for an SRAM cell will stress the "read instability" condition.

To complete the cycle, the port A wordline (125) switches to the low state, thereby disconnecting the bitlines from the cell's internal storage nodes (150, 151). The port A restore line (110) then switches to the low state, turning on PFETs 105, 107 and 141, which in turn precharges the bitlines 115 and 116. The cell data has been read, and all nodes have returned to their original starting state.

For a Port B read operation, the circuit would behave similarly, utilizing restore select line 111, wordline 126 and bitlines 120, 121. Read stability for a Port B read operation will be equally important. As important as this is for a single port read operation, the read stability of the SRAM cell becomes even more important for multi-port memories.

In the illustrated dual-port SRAM cell, one must consider the read stability of the internal storage nodes 150, 151 when accessing data through both ports A and B simultaneously. For example, when both ports A and B in the dual-port static random access memory (SRAM) cell (containing a logical "one") are read simultaneous, both bitlines (e.g., 116, 121) discharge simultaneously into the same "low state" internal storage node (i.e., 150) of the cell. As a result, the increased current into the cell causes the internal "low state" node (150) to rise significantly more than during the previously described single port read access. The maximum read instability will occur when both ports are accessed at precisely the same time.

A dual-port memory cell of such a design must be designed such that, given the absence of any manufacturing defects, the cell will retain it's data for the worst case "read instability" read operation. To those skilled in the art, it is readily apparent that such a design may be achieved by utilizing transistor sizes within the cell, such that the read stability is optimized. Furthermore, it is also understood that process variation must be taken into account when deciding upon transistor sizes.

However, regardless of how well a cell is designed with respect to "read instability", a manufacturing process defect mechanism may occur within the cell, such that the "read stability" of the cell is compromised. It is important to test all cells for the presence of such a defect, prior to delivering products containing the above-mentioned cell design.

Therefore, it is important during testing to determine whether the 2-port SRAM cell will remain stable when both ports are simultaneously accessed. One might attempt to test the cell for read stability by actually accessing the cell from both ports simultaneously. However, performing a test which activates both ports simultaneously has posed a unique challenge to the test community in the past.

More specifically, it is very difficult to match the activation of bitline pair A 115–116 and bitline pair B 120–121, principally because of the different delay paths which precede the different bitline pairs. This is especially true because the bitlines will be activated for a very short period (e.g., picoseconds). Therefore, if the bitlines are not activated within picoseconds of each other, there will not be simultaneous activation.

Only tester clock edge schmooing techniques have been able to conventionally test the read stability of 2-port SRAM cell. Such techniques involve repeatedly adjusting one bitline's clock signal over a range while holding the other bitline's clock signal consistent. In this way, the schmooing technique hopes to simultaneously activate the different bitlines. However, due to time-step granularity limitations, even with such techniques, a simultaneous activation is not guaranteed.

Further, such schmooing techniques have certain limitations, one of which is the difficulty or impracticality of applying clock schmooing when built-in self-test (BIST) methods are employed to test the array at manufacturing test. This is because BIST utilizes only one clock path to access the cell from either port A or B. With only one clock during BIST, it is fundamentally impractical to use a schmooing technique.

Another serious limitation of this technique, and perhaps the most significant, is the prohibitive test time and associated cost involved with schmooing techniques. Schmooing techniques require multiple passes of reading each cell, perhaps as many as several hundred or more passes. Additionally, such techniques do not lend themselves to gathering the large amounts of data required for adequate bit fail mapping.

The invention described below provides an alternative to schmooing that is less time intensive and less expensive.

SUMMARY OF THE INVENTION

It is, therefore, an object of the present invention to provide a structure and method for testing multi-port SRAM cells that includes a test controller connected to at least one multi-port SRAM cell (the test controller is adapted to store a pattern into the multi-port SRAM cell and generate a stability test restore clamp), a read/write controller connected to the multi-port SRAM cell (the read/write controller is adapted to simultaneously activate a plurality of wordline ports on the multi-port SRAM cell while the stability test restore clamp is enabled), and a timing control circuit connected to the read/write controller. The timing control circuit is adapted to vary an activation time of the wordline ports. The read/write controller reads from the multi-port SRAM after the stability test restore clamp is deactivated.

The read/write controller activates the wordline ports for each multi-port SRAM cell in an array sequentially while all bitlines in the array are held on by the stability test restore clamp. The structure also includes a logic device connected to the test controller adapted to prevent the stability test restore clamp from being enabled unless a test is being performed. The timing control circuit is adapted to be selectively externally controllable to vary the activation time of the wordline ports. The timing control circuit can include a plurality of delay units adapted to be selectively engaged to vary the activation time of the wordline ports. The stability test restore clamp is enabled for at least a wordline pulse.

The invention also comprises a method of testing a multi-port SRAM that includes storing a test pattern into at least one multi-port SRAM cell, enabling a stability test restore clamp, simultaneously activating a plurality of wordline ports on the multi-port SRAM cell while the stability test restore clamp is enabled, deactivating the stability test restore clamp, and reading data from the multi-port SRAM cell.

The activating of the wordline ports is performed for each multi-port SRAM cell in an array sequentially while all bitlines in the array are held on by the stability test restore clamp. The invention enables the stability test restore clamp utilizing a logic device that receives at least one test activation signal and the stability test restore clamp. The invention also compares the data to the test pattern to identify a defective multi-port SRAM cell. The stability test restore clamp is enabled for at least a wordline pulse. The invention varies an activation time of the wordline ports using a timing control circuit. The invention selectively engages delay units within the timing control circuit to vary the activation time.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The invention solves the above problems relating to testing dual-port static random access memory (SRAM) cells for "read instability" as follows. A built-in self-test (BIST) controller generates a test pattern which is written to all dual-port SRAM cells. In a separate operation, both read ports are activated simultaneously, while the bitline restore devices of both ports are held in the active state. Also, the read clock to the arrays output latch is disabled, in order to prevent reading unknown data from precharged bitlines. If the test is successful, the non-defective SRAM cells will retain, and defective SRAM cells will lose, the previously written test pattern after the simultaneous activation of both read ports. All SRAM cells are subsequently read to see if the original test pattern data is still valid.

Figure 2:
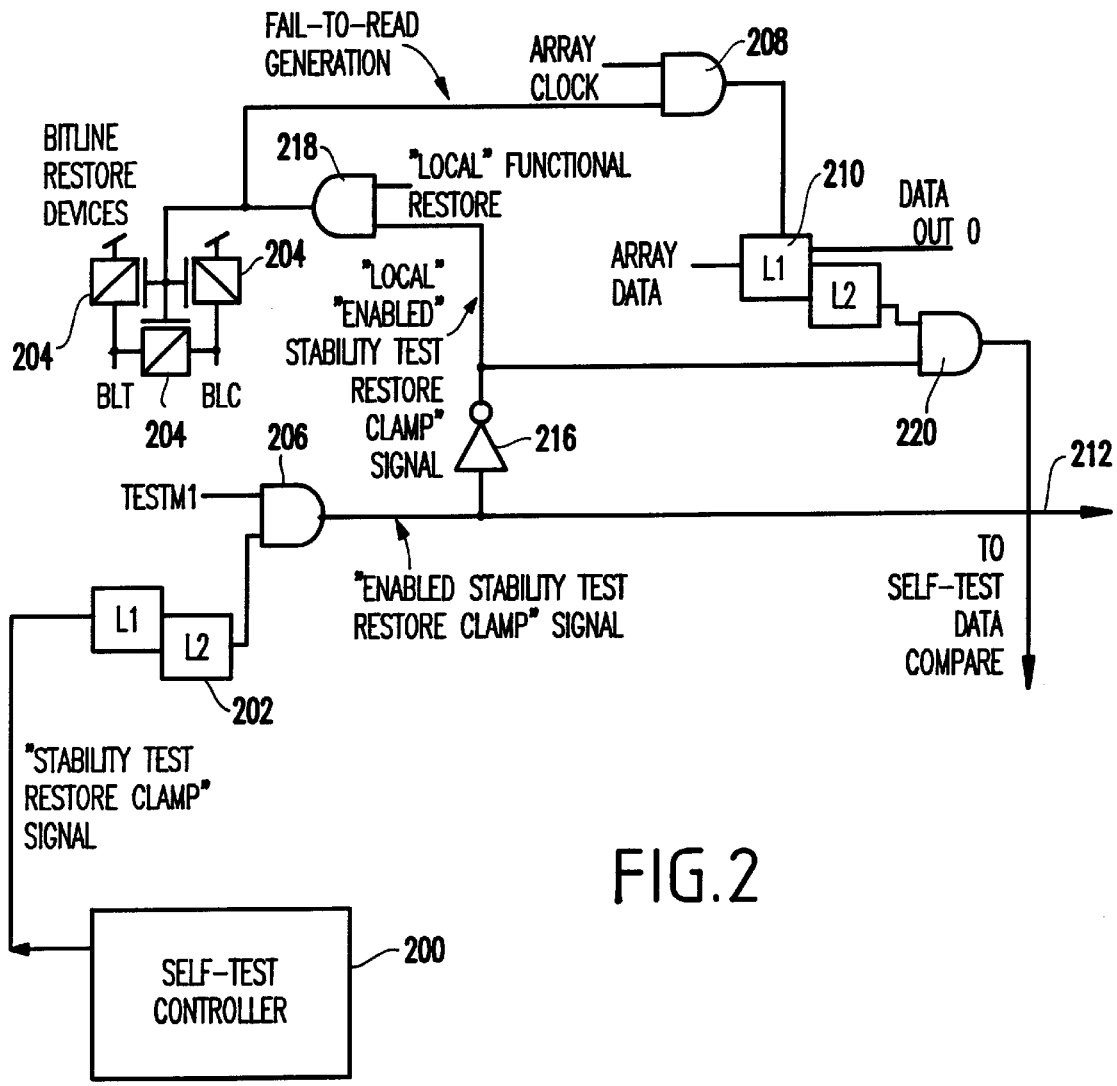
FIG. 2 is a schematic diagram illustrating the inventive test system and method.

FIG. 2 illustrates a test system for one port of the dual-port SRAM cell. To begin the simultaneous activation, the BIST controller 200 activates a signal (stability test restore clamp), which is latched within the SRAM latches L1, L2 (items 202). As shown by arrow 212, the stability test restore clamp is also sent to a companion test circuit for the other port, as well as to the SRAM timing control circuit of FIG. 3.

Figure 1:
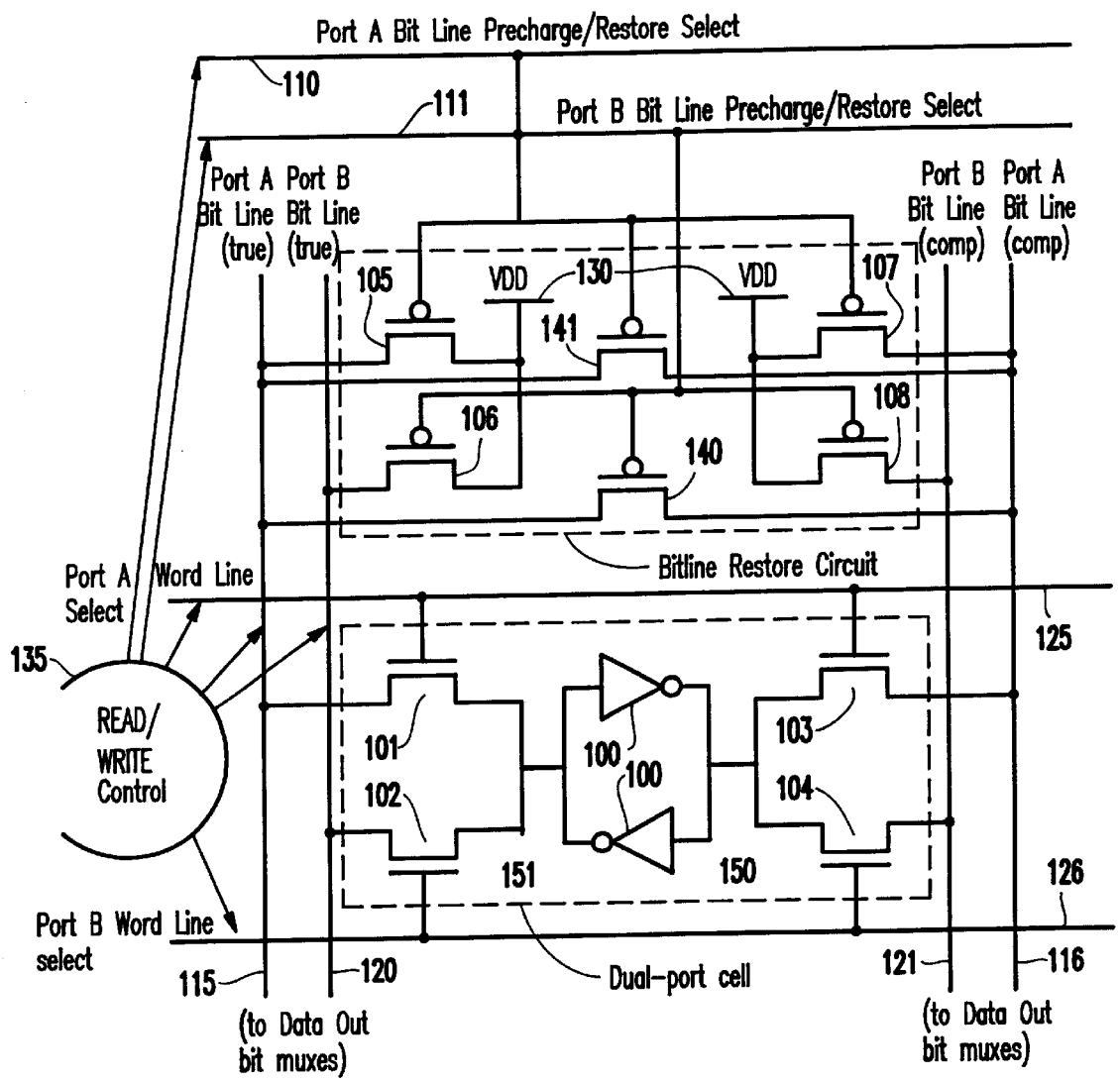
FIG. 1 is a schematic diagram of a dual-port SRAM cell.

The stability test restore clamp is used to hold all bitline restore devices 204 in the "on" state. The bitline restore devices 204 are the same as the restore devices 105–108, discussed with respect to FIG. 1, above.

While the restore devices 204 are in the "on" state, the BIST controller 200 will generate the same address, read select and clock (208) for both port A and port B. As discussed below with respect to FIG. 3, the length of time that both wordlines are held high is increased in order to allow for uncertainties that exist in the separate wordline activation timings. This helps to ensure that both ports are "on" together for a significant duration of time, longer than would occur during a normal functional access, thereby ensuring that defective SRAM cells will lose data and fail. By holding the bitlines 115–116, 120–121 "on" with the stability test restore clamp signal and holding the wordlines 125–126 "on" with the row address strobe for an entire wordline pulse, the invention guarantees that both ports will be simultaneously activated. Therefore, with such simultaneous activation, a dual-port SRAM cell will lose data if a stability fault exists within the cell.

Once this operation is performed on each and every row address, the self-test controller 200 will deactivate the "stability test restore clamp" signal, and then proceed to read the values in latches 210 from each dual-port SRAM cell under control of AND Logic 220, comparing the read value with an expected read value generated by the BIST controller, such that the expect read value is equivalent to the pattern that was originally written to the cells. If a dual-port SRAM cell's data was lost during the stability test operation, the self-test read operation would detect it, thereby exposing the defect within the cell.

The BIST controller is designed as a sequential state machine, and as such will generate a predetermined set of test patterns to be applied to the memory. The "stability test restore clamp" is generated within the BIST controller 200, as a result of some combinational logic that determines when a particular state within the BIST controller has been reached. This state is reached when the desired stability test operation is to be performed. It is generally understood by those skilled in the art, that a sequential state machine may be used to generate self-test patterns.

At system "power-up", the state of a sequential state machine is indeterminate. As such, it is not sufficient to simply use the combinational logic output of some BIST controller latch values to produce the "stability test restore clamp" signal. An "indeterminate" state would perhaps allow the "stability test restore clamp" to be active, in which case, the normal functional operation of the SRAM would be corrupted. This could result in a non-functional SRAM read or write operation, since insufficient signal would be allowed to develop on the columns.

In order to prevent this from happening, the TESTM1 is logically ANDed as shown in item 206 with the "stability test restore clamp" signal, which supplies the "enabled stability test restore clamp" 212 signal through control device 216 shown in FIG. 2. The TESTM1 signal is used to distinguish functional mode from BIST mode.

More specifically, during functional mode the TESTM1 signal is held to a logical "0" state and during BIST, the tester will set the TESTM1 signal to a logical "1" state. Since the TESTM1 signal being input to the 2-way AND 206 is low, the AND 206 will not allow a logical "1" level to be output. Thus, the 2-way AND 206 guarantees that the "enabled stability test restore clamp" signal is held in the non-controlling state during functional mode (e.g., to keep the stability test restore clamp signal from becoming enabled) and only allows the stability test clamp signal to become enabled (e.g., to pass to the bitline restore devices 204) when TESTM1 is at a logical "1". A local functional restore signal is similarly used to control AND logic 218 to restrict the clamp signal from reaching the bitline restore devices 204.

Figure 3:
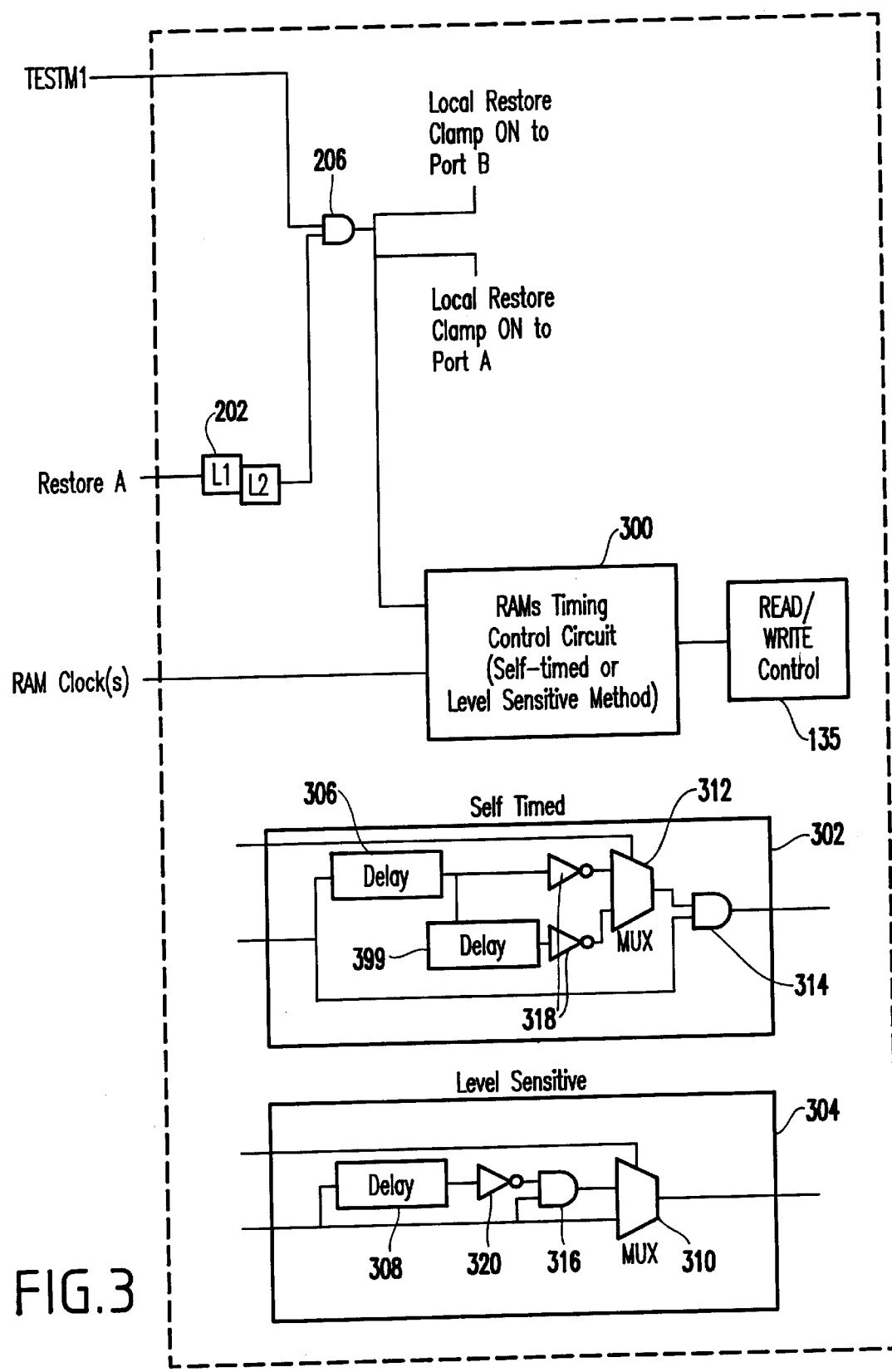
FIG. 3 is a schematic diagram illustrating one exemplary implementation of the invention.

As shown in FIG. 3, the output of the 2-way AND 206 is applied to the SRAM timing control circuit 300. The SRAM timing control circuit 300 extends the wordline pulse width supplied to the read/write control 135 to insure an adequate overlap between the port A pulse and the port B pulse. This can be accomplished through a self-timed timing control circuit 302 or a level sensitive timing control circuit 304.

In the self-timed method shown in item 302, additional delay elements 306 are included to increase the time between the wordline "on" and wordline "off" signals. The AND gate 314 is part of an edge triggered pulse generator which generates a pulse of a width determined by delay element 306. When the "enabled stability test restore clamp" signal selects the multiplexer 312, the multiplexer output is additionally delayed with the additional delay element 399, such that the pulse width (output of 314) is then determined by adding the delays of elements 306 and 399 (which are supplied through control elements 318).

In the level sensitive method shown in item 304, when the "enabled stability test restore clamp" signal is inactive the internal timing circuit is selected. The output of 316 is a pulse where the width is determined by delay element 308 supplied through control element 320. This pulse is normally used by the SRAM for internal timings during functional mode and other unrelated BIST operations. When the "enabled stability test restore clamp" signal is active, the other input to the multiplexer 310 is selected. The internal SRAM clock pulse width timing is now directly controlled by the input clock pulse width. The tester will now have the ability to enable the wordlines for as long as is desired, during test operations.

Either the self-timed or level-sensitive method may be employed, in order to operate the stability test. An advantage of the level sensitive method is that the length of time that both ports are held active may be greatly increased, at the time of test, and as such is somewhat more flexible. A disadvantage of the level-sensitive method is that internal chip timing paths must be understood, in order for the testing to be done properly. Conversely, the self-timed method may be applied without knowledge of the internal path delays. However, the self-timed test method is somewhat inflexible with respect to the length of time that the ports are held "on".

The invention is described above with respect to a 2-port SRAM cell; however, the invention is equally applicable to any multi-port SRAM cell. Therefore, the invention can be easily applied by one ordinarily skilled in the art to a 3, 4, 5, etc. port SRAM cell. Such higher level port SRAM cells are not illustrated so as not to obscure the salient features of the invention. However, one ordinarily skilled in the art would readily understand the minor differences required to alter the 2-port SRAM structure discussed above into an N-port SRAM structure. Furthermore, it will also be understood by those well versed in the practice of utilizing, designing or testing dual-port memories, that the above invention may be easily extended to similar multi-port SRAM cell designs.

Also, while the example above discusses both ports of a 2-port SRAM cell being simultaneously activated, in higher-level multi-port SRAM cells, the invention can selectively activate all ports or less than the total number of ports available. Therefore, for example in a 10-port SRAM cell, the invention can selectively simultaneously activate 3 of the 10 ports.

An important benefit of the inventive stability tester, is the ability to test for defective dual-port SRAM cells in a very short amount of time. Furthermore, this tester/test method allows functional applications where both ports are used "asynchronously". The importance of this will be easily recognizable to those well versed in the practice of utilizing, designing or testing dual-port memories.

While the invention has been described in terms of preferred embodiments, those skilled in the art will recognize that the invention can be practiced with modification within the spirit and scope of the appended claims.

What is claimed is:

1. A system for testing multi-port static random access memory (SRAM) cells comprising:
    a test controller connected to at least one multi-port SRAM cell, said test controller being adapted to store a pattern into said multi-port SRAM cell and generate a stability test restore clamp; and
    a read/write controller connected to said multi-port SRAM cell, said read/write controller being adapted to simultaneously activate a plurality of wordline ports on said multi-port SRAM cell while said stability test restore clamp is enabled,
    wherein said read/write controller reads from said multi-port SRAM after said stability test restore clamp is deactivated.

2. The system in claim 1, wherein said read/write controller activates said wordline ports for each multi-port SRAM cell in an array sequentially while all bitlines in said array are held on by said stability test restore clamp.

3. The system in claim 1, further comprising a logic device connected to said test controller adapted to prevent said stability test restore clamp from being enabled unless a test is being performed.

4. The system in claim 1, further comprising a timing control circuit connected to said read/write controller, said timing control circuit being adapted to vary an activation time of said wordline ports.

5. The system in claim 4, wherein said timing control circuit is adapted to be selectively externally controllable to vary said activation time of said wordline ports.

6. The system in claim 4, wherein said timing control circuit includes a plurality of delay units adapted to be selectively engaged to vary said activation time of said wordline ports.

7. The system in claim 1, wherein said stability test restore clamp is enabled for at least a wordline pulse.

8. A system for testing multi-port static random access memory (SRAM) cells comprising:
   a test controller connected to at least one multi-port SRAM cell, said test controller being adapted to store a pattern into said multi-port SRAM cell, and generate a stability test restore clamp;
   a read/write controller connected to said multi-port SRAM cell, said read/write controller being adapted to simultaneously activate a plurality of wordline ports on said multi-port SRAM cell while said stability test restore clamp is enabled; and
   a timing control circuit connected to said read/write controller, said timing control circuit being adapted to vary an activation time of said wordline ports,
   wherein said read/write controller reads from said multi-port SRAM after said stability test restore clamp is deactivated.

9. The system in claim 8, wherein said read/write controller activates said wordline ports for each multi-port SRAM cell in an array sequentially while all bitlines in said array are held on by said stability test restore clamp.

10. The system in claim 8, further comprising a logic device connected to said test controller adapted to prevent said stability test restore clamp from being enabled unless a test is being performed.

11. The system in claim 8, wherein said timing control circuit is adapted to be selectively externally controllable to vary said activation time of said wordline ports.

12. The system in claim 8, wherein said timing control circuit includes a plurality of delay units adapted to be selectively engaged to vary said activation time of said wordline ports.

13. The system in claim 8, wherein said stability test restore clamp is enabled for at least a wordline pulse.

14. A method of testing multi-port static random access memory (SRAM) cells comprising:
   storing a test pattern into at least one multi-port SRAM cell;
   enabling a stability test restore clamp;
   simultaneously activating a plurality of wordline ports on said multi-port SRAM cell while said stability test restore clamp is enabled;
   deactivating said stability test restore clamp; and
   reading data from said multi-port SRAM cell.

15. The method in claim 14, wherein said activating of said wordline ports is performed for each multi-port SRAM cell in an array sequentially while all bitlines in said array are held on by said stability test restore clamp.

16. The method in claim 14, further comprising enabling said stability test restore clamp utilizing a logic device that receives at least one test activation signal and said stability test restore clamp.

17. The method in claim 14, further comprising comparing said data to said test pattern to identify a defective multi-port SRAM cell.

18. The method in claim 14, wherein said stability test restore clamp is enabled for at least a wordline pulse.

19. The method in claim 14, further comprising varying an activation time of said wordline ports using a timing control circuit.

20. The method in claim 19, further comprising selectively engaging delay units within said timing control circuit to vary said activation time.

* * * * *